United States Patent
Sreedharamurthy et al.

(10) Patent No.: US 6,866,713 B2
(45) Date of Patent: Mar. 15, 2005

(54) SEED CRYSTALS FOR PULLING SINGLE CRYSTAL SILICON

(75) Inventors: Hariprasad Sreedharamurthy, Ballwin, MO (US); Mohsen Banan, Grover, MO (US)

(73) Assignee: MEMC Electronic Materials, Inc., St. Peters, MO (US)

(*) Notice: Subject to any disclaimer, the term of this patent is extended or adjusted under 35 U.S.C. 154(b) by 0 days.

(21) Appl. No.: 10/281,632

(22) Filed: Oct. 28, 2002

(65) Prior Publication Data

US 2003/0079673 A1 May 1, 2003

Related U.S. Application Data

(60) Provisional application No. 60/347,994, filed on Oct. 26, 2001.

(51) Int. Cl.[7] ............................ C30B 15/36; C30B 15/00
(52) U.S. Cl. ........................... 117/13; 117/35; 117/902; 117/931; 117/932
(58) Field of Search .......................... 117/13, 35, 902, 117/931, 932

(56) References Cited

U.S. PATENT DOCUMENTS

| | | | |
|---|---|---|---|
| 4,299,651 A | * 11/1981 | Bonner | 117/17 |
| 5,454,424 A | * 10/1995 | Mori et al. | 164/469 |
| 5,487,355 A | 1/1996 | Chiou et al. | |
| 5,628,823 A | * 5/1997 | Chandrasekhar et al. | 117/15 |
| 5,714,267 A | 2/1998 | Machida et al. | |
| 5,853,480 A | 12/1998 | Kubota et al. | |
| 5,871,578 A | 2/1999 | Iino et al. | |
| 5,879,448 A | 3/1999 | Urano et al. | |
| 5,885,344 A | 3/1999 | Kim et al. | |
| 5,911,822 A | 6/1999 | Abe et al. | |
| 5,916,364 A | 6/1999 | Izumi | |
| 5,919,302 A | * 7/1999 | Falster et al. | 117/3 |
| 5,932,002 A | 8/1999 | Izumi | |
| 5,932,007 A | * 8/1999 | Li | 117/208 |

(List continued on next page.)

FOREIGN PATENT DOCUMENTS

| | | | |
|---|---|---|---|
| EP | 0 499 220 A1 | * 8/1992 | |
| EP | 0 671 491 A1 | * 9/1995 | |
| EP | 0 747 512 A2 | * 12/1996 | |
| EP | 747512 A2 | * 12/1996 | ........... C30B/15/00 |
| EP | 0 949 359 A1 | * 10/1999 | |
| EP | 0 854 211 B1 | * 8/2001 | |
| JP | 04-104988 | * 4/1992 | |
| JP | 09-235186 | 9/1997 | |
| JP | 09-249492 | 9/1997 | |
| JP | 09-255485 | 9/1997 | |
| JP | 11-199384 | 7/1999 | |
| WO | WO 99/07922 A1 | 2/1999 | |
| WO | WO 01-27360 A1 | 4/2001 | |

OTHER PUBLICATIONS

Hoshikawa, K., et al., Dislocation–Free Czochralski Silicon Crystal Growth Without the Dislocation–Elimination–Necking Process, Japanese Journal of Applied Physics, Dec. 1, 1999, pp. L1369–L1371, vol. 38, No. 12A, Part 2, Tokyo, Japan.

Kim, K.M., et al., Maximum Length of Large Diameter Czochralski Silicon Single Crystals at Fracture Stress Limit of Seed, Journal of Crystal Growth, Mar. 1990, pp. 527–528, vol. 100, No. 3, Amsterdam, North–Holland.

*Primary Examiner*—Nadine G. Norton
*Assistant Examiner*—Matthew Song
(74) *Attorney, Agent, or Firm*—Senniger Powers

(57) ABSTRACT

The present invention provides for a process for preparing a single crystal silicon ingot by the Czochralski method. The process comprises selecting a seed crystal for Czochralski growth wherein the seed crystal comprises vacancy dominated single crystal silicon.

14 Claims, 1 Drawing Sheet

U.S. PATENT DOCUMENTS

| | | | |
|---|---|---|---|
| 5,935,321 A | | 8/1999 | Chiou et al. |
| 5,964,941 A | | 10/1999 | Iino et al. |
| 5,993,539 A | * | 11/1999 | Izumi |
| 6,019,836 A | * | 2/2000 | Izumi .......................... 117/13 |
| 6,022,411 A | * | 2/2000 | Kuramoto |
| 6,080,237 A | * | 6/2000 | Iwasaki et al. ............... 117/13 |
| 6,146,459 A | * | 11/2000 | Park |
| 6,162,292 A | * | 12/2000 | Iino ............................. 117/13 |
| 6,171,391 B1 | * | 1/2001 | Fuerhoff et al. |
| 6,197,108 B1 | * | 3/2001 | Iino et al. .................... 117/13 |
| 6,197,111 B1 | * | 3/2001 | Ferry et al. |
| 6,267,815 B1 | * | 7/2001 | Ehlert et al. .................. 117/13 |
| 6,379,642 B1 | * | 4/2002 | Falster et al. |
| 2001/0008114 A1 | * | 7/2001 | Falster et al. ................. 117/3 |

* cited by examiner

SEED CRYSTALS FOR PULLING SINGLE CRYSTAL SILICON

CROSS REFERENCE TO RELATED APPLICATIONS

This application claims priority from U.S. Provisional Application Ser. No. 60/347,994, filed Oct. 26, 2001, which is hereby incorporated herein by reference in its entirety.

BACKGROUND OF THE INVENTION

The present invention generally relates to the preparation of semiconductor grade single crystal silicon used in the manufacture of electronic components. More particularly, the present invention relates to a novel seed crystal for pulling a single crystal silicon ingot, in accordance with the Czochralski method, wherein a reduced number of dislocations are produced when the seed crystal contacts the crystal melt. Additionally, this invention relates to a process for the Czochralski growth of silicon single crystals, which uses such a novel seed crystal. The reduction in the number of dislocations produced upon contacting the seed crystal with the crystal melt results in the growth of dislocation-free crystals of large diameter and heavy weight having necks of relatively large diameter and short length.

Silicon single crystal, which is the starting material for most processes in the fabrication of semiconductor electronic components, is commonly prepared by the Czochralski ("Cz") method. In this method, polycrystalline silicon ("polysilicon") is charged to a crucible and melted. A seed crystal is brought into contact with the molten silicon and a single crystal is grown by slow extraction. As crystal growth is initiated, dislocations are generated in the crystal from the thermal shock of contacting the seed crystal with the melt. These dislocations are propagated throughout the growing crystal and multiplied unless they are eliminated in the neck region between the seed crystal and the main body of the crystal.

The conventional method of eliminating dislocations within silicon single crystal (known as the Dash neck method) involves growing a neck having a small diameter (e.g., 2 to 4 mm) at a high crystal pull rate (as high as 6 mm/min) to completely eliminate dislocations before initiating growth of the main body of crystal. Generally, dislocations can be eliminated in these small diameter necks after approximately 100 to about 125 mm of neck is grown. Once the dislocations have been eliminated, the diameter of the crystal is enlarged to form a crown or taper portion until the desired diameter of the cylindrical main body is reached. The cylindrical main body of the crystal is then grown to have an approximately constant diameter by controlling the pull rate and the melt temperature while compensating for the decreasing melt level.

The neck, which is the weakest part of the silicon single crystal, can fracture during crystal growth causing the body of crystal to drop into the crucible. Thus, conventional crystals having a Dash neck are typically grown to a weight of 100 kg or less to minimize stress on the neck. However, in recent years, progress in the semiconductor industry has created an ever-increasing demand for larger silicon wafers of a high quality. Particularly, more highly integrated semiconductor devices have resulted in increased chip areas and a demand for the production of silicon wafers having a diameter of 200 mm (8 inches) to 300 mm (12 inches) or more. This has resulted in the need for a more effective necking process which eliminates dislocations and prevents neck fractures while supporting the growth of silicon single crystals weighing up to 300 kg or more.

A general solution for preventing neck fractures in larger crystals is to increase the neck diameter. However, large diameter necks are generally undesirable as they require larger seed crystals, which produce a higher density of slip dislocations when contacted with the silicon melt. Thus, larger diameter neck portions require an increased neck length and more process time to effectively eliminate slip dislocations.

In order to minimize the generation of slip dislocations in a larger diameter Dash neck, Japanese laid-open application (Kokai) No. 4-104988 proposed a process using a seed crystal having a unique, conical portion at its apex. However, such a seed crystal is complicated and expensive to process. Because the crystal is unique to a particular crystal pull, the seed crystal must be changed between each crystal pull regardless of whether dislocation-free growth is successful. Changing the seed crystal requires extra process downtime, which adversely affects productivity. Furthermore, the reference describes a heater embedded in the seed crystal holder, which makes it more difficult to form a temperature gradient between the seed crystal and the neck portion such that the single crystal must be pulled at an extremely slow rate.

Another method to prevent propagation of dislocations to the single crystal is disclosed in Japanese Patent Laid-Open No. 9-235186 and is directed toward pre-heating the seed crystal before contacting the crystal melt by interrupting the downward movement of the crystal at a position immediately above the melt. After pre-heating, the seed crystal is gradually lowered into the melt at a decreasing speed. This method is problematic because even if the seed crystal is stationary above the melt for a long period, the temperature cannot be raised in proportion to the time elapsed due to the low thermal conductivities of argon gas and silicon.

In view of the forgoing, it can be seen that a need continues to exist for a process that enables large diameter ingots of substantial weight to be grown by means of a neck having a comparably large diameter but short length.

SUMMARY OF THE INVENTION

Among the several features of the invention, therefore, may be noted the provision of a seed crystal for pulling single crystal silicon, as well as a process for using the same to grow a single crystal silicon ingot having a large diameter or mass; the provision of such a process wherein the throughput and yield are increased; the provision of such a process wherein the ingot has a large diameter neck; the provision of such a process wherein the number of slip dislocations produced upon contact of the seed crystal with the silicon melt is significantly reduced; and the provision of such a process wherein slip dislocations are eliminated in the neck over a substantially reduced length.

Briefly, therefore, one embodiment of the invention is directed to a process for preparing a single crystal silicon ingot, grown in accordance with the Czochralski method. The process comprises heating polycrystalline silicon in a crucible to form a silicon melt. A silicon seed crystal for contacting the silicon melt is selected to have crystal lattice vacancies as the predominant intrinsic point defect (i.e., a seed crystal comprising vacancy dominated silicon is selected), and contacted to the silicon melt until the crystal begins to melt. Upon contact with the melt, dislocations are formed in the seed crystal. The seed crystal is then withdrawn from the melt to grow a neck portion of the ingot wherein such dislocations are eliminated from the neck. An outwardly flaring seed-cone is then grown adjacent the neck portion of the ingot; and, a main body of the ingot having a nominal diameter of at least about 150 mm is grown adjacent the outwardly flaring seed-cone.

In another embodiment, the present invention is directed to a seed crystal for preparing a single crystal silicon ingot in accordance with the Czochralski method. The seed crystal comprises single crystal silicon having crystal lattice vacancies are the predominant intrinsic point defect therein. In one embodiment, the seed crystal of the present invention comprises single crystal silicon having a critical resolved shear stress of at least about 950 psi, preferably at least about 1000 psi. In another embodiment, the seed crystal of the present invention comprises single crystal silicon and has a critical resolved shear stress which is at least about 25% higher than a conventional single crystal silicon seed crystal. In still another embodiment, the seed crystal of the present invention has a critical resolved shear stress which is at least about 30% higher than a conventional seed crystal.

Other objects and features of this invention will be in part apparent and in part pointed out hereinafter.

DETAILED DESCRIPTION OF THE PREFERRED EMBODIMENTS

Figure 1:
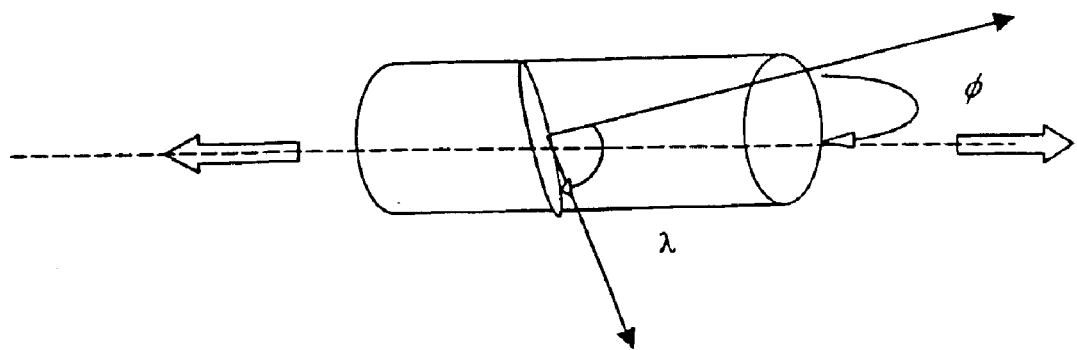
FIG. 1 is schematic demonstrating the relationship between the tensile axis, the slip plane and the slip direction of a silicon single crystal.

In accordance with the present invention, it has been discovered that, by using the seed crystal of the present invention in the Czochralski growth of a single crystal silicon ingot, the concentration of slip dislocations produced when contacting the seed crystal to the silicon melt can be significantly reduced and thus, such slip dislocations can be eliminated from the neck portion of the single crystal silicon ingot over a much shorter length or distance, even for ingots having a large diameter and substantial weight. More specifically, it has been discovered that, in comparison to conventional methods for growing large diameter and/or large mass single crystal silicon ingots, the number of initial slip dislocations produced when contacting the seed crystal to the silicon melt and the length over which such slip dislocations are eliminated in the neck of a single crystal silicon ingot, particularly a neck having a large diameter, can be significantly reduced by using a vacancy dominated seed crystal (i.e., a seed crystal wherein crystal lattice vacancies are the predominant intrinsic point defect).

Single crystal silicon grown from a crystal melt typically comprises intrinsic point defects. There are primarily two types of intrinsic point defects, crystal lattice vacancies and silicon self-interstitials. It is believed that the type and initial concentration of intrinsic point defects in a silicon crystal are determined during crystal growth as the crystal cools during solidification. Thus, by controlling the crystal growth process, and particularly the temperature gradients during cooling, it is possible to produce silicon having either crystal lattice vacancies as the predominant intrinsic point defect (i.e., vacancy dominated silicon) or silicon self-interstitials as the predominant intrinsic point defect (i.e., self-interstitial dominated silicon). Intrinsic point defects and the preparation of vacancy dominated silicon are detailed, for example, in U.S. Pat. No. 5,919,302 and U.S. Pat. No. 6,379,642. The entire texts of U.S. Pat. No. 5,919,302 and U.S. Pat. No. 6,379,642 are hereby incorporated herein by reference.

Conventional seed crystals for use in the Czochralski method for growing single crystal silicon ingots are typically made from undoped silicon without regard to the type or concentration of intrinsic point defects present in the seed crystal. However, it has been discovered in accordance with the present invention that controlling the types of defects present in the seed crystal, particularly by using a seed crystal prepared from silicon having crystal lattice vacancies as the predominant intrinsic point defect (i.e., a vacancy dominated seed crystal), the number of dislocations produced when the seed crystal contacts the silicon melt during Czochralski crystal growth can be significantly reduced.

Without being held to a particular theory, it has been found that the vacancy dominated seed crystals of the present invention are able to withstand a greater temperature difference between the melt and the seed crystal without creating slip dislocations. For example, it has been found that a vacancy dominated seed crystal possesses an increased critical resolved shear stress. Because the critical resolved shear stress corresponds to the level of thermal stress where dislocations are formed, vacancy dominated crystals having a higher critical resolved shear stress than a conventional seed crystal will be more resistant to thermal stress and therefore form less dislocations than a conventional seed crystal when contacted to the silicon melt under similar conditions.

It is important to note that experience to date suggests that seed crystals comprising any type of vacancy dominated silicon are suitable for use in the process of the present invention. For example, suitable vacancy dominant silicon includes vacancy dominated silicon substantially free of agglomerated defects and vacancy dominated silicon comprising agglomerated vacancy defects such as voids or D-defects. For example, in one embodiment, the silicon seed crystal selected for use in the present invention comprises vacancy dominated silicon comprising voids or D-defects.

Calculation of Thermal Stress

Typically, when a solid seed crystal contacts the liquid melt to begin the Czochralski growth process, the seed crystal, which is at a lower temperature than the liquid melt, is subjected to thermal shock. The thermal shock introduces a thermal stress into the seed crystal which is governed by Equation 1 as follows:

$$\sigma = E\alpha_1(T_0 - T_f), \qquad (1)$$

wherein $\sigma$ represents the thermal stress, E represents Young's Modulus, $\alpha_1$ is a coefficient of thermal expansion, and $(T_0 - T_f)$ is the temperature difference between the seed crystal and the liquid melt. Thus, the rapid temperature changes caused by contacting the silicon melt produce temperature gradients in the seed material with resulting residual stresses internal to the seed crystal. The effect can be summarized in that the higher the thermal shock or temperature gradient, the higher the thermal stress.

When the magnitude of the thermal stress exceeds that of a critical resolved shear stress (CRSS), dislocations form within the seed crystal. The number of dislocations generated is directly proportional to the magnitude of the thermal stress. Therefore, if the seed crystal has a higher value of critical resolved shear stress, the thermal stress required to generate dislocations is also higher. Further, the number of dislocations generated increases proportionally as the value of the thermal stress exceeds that of the critical resolved shear stress. The relationship between thermal stress and the number of dislocations produced is demonstrated in Equation 2 as follows:

$$\sigma/E = \epsilon = \eta \times B \qquad (2)$$

wherein $\sigma$ represents the residual thermal stress, E represents Young's Modulus, $\epsilon$ represents the strain, $\eta$ represents the number of dislocations and B represents Burger's vector. Thus, a crystal having a higher critical resolved shear stress than a conventional seed crystal will produce less dislocations than the conventional seed crystal when subjected to identical thermal stress conditions.

Calculation of the Critical Resolved Shear Stress

When a tensile stress is applied to a silicon single crystal, shear components exist at all but parallel and perpendicular alignments to the stress direction. These are termed resolved shear stresses. The magnitude of a resolved shear stress in a silicon crystal depends on the magnitude of the applied stresses as well as the orientation of the slip plane and direction within that plane that the stress is applied. Referring to FIG. 1, $\phi$ represents the angle between normal to the slip plane and $\lambda$ represents the angle between the slip plane and the stress direction. The resolved shear stress is governed by Equation 3 as follows:

$$\tau_R = \sigma \cos \phi \cos \lambda \quad (3)$$

wherein $\tau_R$ represents the resolved shear stress and $\sigma$ represents the applied stress. Thus, when the resolved shear stress in response to an applied tensile stress reaches its maximum or critical value (i.e., the critical resolved shear stress), plastic deformation and yielding occur. The critical resolved shear stress ($\tau_{CRSS}$) can be further defined by Equation 4 as follows:

$$\tau_{CRSS} = (F \cos \lambda)/A_S = (F/A_0)\cos \phi \cos \lambda = \sigma/m \quad (4)$$

wherein $\lambda$ represents the angle between the tensile axis and the slip direction as indicated in FIG. 1, F represents the applied tensile force, $\phi$ represents the angle between the tensile axis and the slip plane normal as illustrated in FIG. 1, $A_S$ represents the area of the slip plane, $A_0$ represents the transverse cross sectional area of the crystal, and m represents $(\cos \lambda \cos \phi)^{-1}$.

Thus, in accordance with the present invention, it has been discovered that increasing the number of crystal lattice vacancies within the seed crystal increases the critical resolved shear stress of the seed crystal. For example, the critical resolved shear stress for a vacancy dominated seed crystal typically ranges from about 950 psi to about 1100 psi. In other words, the critical resolved shear stress for a vacancy dominated seed crystal is typically at least about 25% higher (e.g., at least about 30%, about 35%, or about 40% higher) than the critical resolved shear stress of a conventional seed crystal wherein crystal lattice vacancies are not the predominant intrinsic point defect.

Accordingly, it has been found that the seed crystals of the present invention having a higher critical resolved shear stress can withstand higher thermal stress before dislocations are formed therein. Further, even when the thermal stress exceeds the critical resolved shear stress to form dislocations, a higher critical resolved shear stress relative to the thermal stress will result in less dislocations being formed. Thus, it has been found that using a vacancy dominated seed crystal reduces the number of dislocations produced when the seed crystal contacts the silicon melt relative to the number of dislocations produced using a conventional seed crystal under identical process conditions.

When dislocations are formed by contacting the seed crystal to the silicon melt, the dislocations are propagated throughout the growing crystal and multiplied unless they are eliminated in the neck region between the seed crystal and the main body of the crystal. For large diameter necks, such as those needed for large diameter, heavy ingots, the length of the neck which must be grown to remove these dislocations is significant (e.g., about 175 mm or more).

However, in accordance with the present invention, it has been found that the length of the neck needed to achieve dislocation-free growth can be substantially reduced through the use of a vacancy dominated seed crystal. For example, as described above, it has been found that by using a vacancy dominated seed crystal for the Czochralski growth of a single crystal silicon ingot, the number of dislocations produced when the seed crystal contacts the silicon melt is significantly reduced. Because the number of dislocations produced is significantly smaller, even when growing large diameter crystals, there are less dislocations to eliminate in the necking process. Thus, the use of a vacancy dominated seed crystal results in the elimination of dislocations over a much shorter axial distance or length (e.g., less than about 175 mm) for large diameter, heavy ingots.

Accordingly, unlike existing Dash-neck processes, wherein (i) relatively small diameter ingots (e.g., ingots less than about 150 or even about 100 mm in diameter) are grown by a process wherein fast pull rates (e.g., about 6 mm/min. or more) are employed during growth of a neck having a diameter of less than about 4 mm (e.g., from about 2 to about 4 mm) and a length of less than about 100 mm, or (ii) larger diameter ingots (e.g., ingots greater than about 150 mm in diameter) are grown by various processes wherein the neck has a large diameter (e.g., greater than about 5 mm) and a length of greater than about 150 mm, the present invention enables the safe and efficient growth of heavy, large diameter single crystal silicon ingots by means of a process wherein a large diameter neck having a comparably short length is formed. More specifically, the process of the present invention can form a dislocation-free neck having a diameter of greater than about 5 mm (e.g., about 6, 8, 10 mm or more) and a length of less than about 175 mm (e.g., less than about 160, 145, 130, 115, 100 mm or less), which is capable of supporting large diameter (e.g., about 200, 300 mm or more), heavy weight (e.g., about 100, 200, 300, 400 kilograms or more) single crystal silicon ingots.

Further, it has been found that the vacancy dominated seed crystals allow for easier processing of the seed crystal than other methods of preparing seed crystals to reduce thermal stress. The vacancy dominated seed crystals of the present invention can be normally machined from vacancy dominated silicon in any crystal orientation and in a standard shape. In contrast to prior art seed crystals, there is no complicated machining of unique seed crystal shapes or difference in composition throughout the seed crystal. Therefore, the advantages of the seed crystals of the present invention may be used to more effectively produce a larger, heavier single crystal silicon ingot.

EXAMPLES

The following Examples set forth one approach that may be used to carry out the process of the present invention. Accordingly, these should not be interpreted in a limiting sense.

Example 1

This example compares calculations of the critical resolved shear stress in a standard seed crystals versus that in a vacancy dominated seed crystal.

Three samples of 20-mm deep round notch seed crystals were machined from vacancy dominated silicon crystal. The samples comprised single crystal silicon having crystal orientation <001>. The samples were first etched to remove any surface defects and then tested for tensile strength (i.e., yield strength) using hydraulic testing equipment. The hydraulic testing equipment, comprising a load cell, was operated at a standard loading rate of 1 millimeter per minute. The tensile loads were applied in the <100> direction. The average load at which the seeds broke was 2503.33 pounds. Using the cross-sectional area of 19.5 mm×19.5 mm, the average yield strengths were calculated to be 4247.94 psi.

The slip plane pulled in tension is <111> and the direction of the slip is <110>. Therefore, the angle between the slip plane and the tensile direction, $\phi$, was calculated to be 54.74 degrees. Similarly, the angle between the slip direction and the tensile force, $\lambda$, was calculated to be 45 degrees. Thus, substituting the values of $\phi$ and $\lambda$ into Equation 1, the critical resolved shear stress was calculated to be 1021 psi.

The critical resolved shear stress was then calculated in six conventional seed crystal samples. The average load for the six samples was 1590.8 lbs. The critical resolved shear stress was 649.4 psi.

Thus, the critical resolved shear stress for the vacancy dominated seed crystals was much higher than that of the standard seed crystals.

What is claimed is:

1. A process for preparing a single crystal silicon ingot, grown in accordance with the Czochralski method, the process comprising:

heating polycrystalline silicon in a crucible to form a silicon melt;

selecting a seed crystal for contacting the crystal melt, said seed crystal having crystal lattice vacancies as the predominant intrinsic point defect therein;

contacting said seed crystal to the silicon melt until the seed crystal begins to melt, forming dislocations therein;

withdrawing the seed crystal from the melt to grow a neck portion of the ingot, wherein during the withdrawal dislocations are eliminated from the neck;

growing an outwardly flaring seed-cone adjacent the neck portion of the ingot; and, growing a main body adjacent the outwardly flaring seed-cone, the body having a nominal diameter of at least about 150 mm.

2. A process as set forth in claim 1 wherein said seed crystal comprises vacancy dominated silicon substantially free of agglomerated defects.

3. A process as set forth in claim 1 wherein said seed crystal comprises vacancy dominated silicon comprising voids or D-defects.

4. A process as set forth in claim 1 wherein the body has a nominal diameter of at least about 200 mm.

5. A process as set forth in claim 1 wherein the body has a nominal diameter of at least about 300 mm.

6. A process as set forth in claim 1 wherein the body has a weight of at least about 100 kilograms.

7. A process as set forth in claim 1 wherein the body has a weight of at least about 200 kilograms.

8. A process as set forth in claim 1 wherein dislocations are eliminated in the neck within an axial length of less than about 175 mm.

9. A process as set forth in claim 1 wherein dislocations are eliminated in the neck within an axial length of less than about 100 mm.

10. A process as set forth in claim 1 wherein the neck has a nominal diameter of at least about 5 mm.

11. A process as set forth in claim 1 wherein the neck has a nominal diameter of from about 6 mm to about 8 mm.

12. A process as set forth in claim 1 wherein the neck has a nominal diameter of at least about 10 mm.

13. A process as set forth in claim 1 wherein said seed crystal has a critical resolved shear stress of at least about 950 psi.

14. A process as set forth in claim 1 wherein said seed crystal has a critical resolved shear stress of at least about 1000 psi.

* * * * *